(12) United States Patent
Kang et al.

(10) Patent No.: US 10,262,951 B2
(45) Date of Patent: Apr. 16, 2019

(54) RADIATION HARDENED MICROELECTRONIC CHIP PACKAGING TECHNOLOGY

(71) Applicants: Jin Ho Kang, Newport News, VA (US); Godfrey Sauti, Hampton, VA (US); Cheol Park, Yorktown, VA (US); Luke Gibbons, Williamsburg, VA (US); Sheila Ann Thibeault, Hampton, VA (US); Sharon E. Lowther, Hampton, VA (US); Robert G. Bryant, Williamsburg, VA (US)

(72) Inventors: Jin Ho Kang, Newport News, VA (US); Godfrey Sauti, Hampton, VA (US); Cheol Park, Yorktown, VA (US); Luke Gibbons, Williamsburg, VA (US); Sheila Ann Thibeault, Hampton, VA (US); Sharon E. Lowther, Hampton, VA (US); Robert G. Bryant, Williamsburg, VA (US)

(73) Assignees: National Institute of Aerospace Associates, Hampton, VA (US); The United States of America as represented by the Administrator of NASA, Washington, DC (US)

( * ) Notice: Subject to any disclaimer, the term of this patent is extended or adjusted under 35 U.S.C. 154(b) by 8 days.

(21) Appl. No.: 14/279,601

(22) Filed: May 16, 2014

(65) Prior Publication Data
US 2015/0069588 A1 Mar. 12, 2015

Related U.S. Application Data

(60) Provisional application No. 61/855,488, filed on May 16, 2013.

(51) Int. Cl.
*H01L 21/44* (2006.01)
*H01L 23/556* (2006.01)
(Continued)

(52) U.S. Cl.
CPC .......... *H01L 23/556* (2013.01); *H01L 21/311* (2013.01); *H01L 21/78* (2013.01);
(Continued)

(58) Field of Classification Search
CPC . H01L 23/556; H01L 23/552; H01L 23/3107; H01L 21/311; H01L 2224/03831;
(Continued)

(56) References Cited

U.S. PATENT DOCUMENTS 4,468,411 A * 8/1984 Sloan ............... H01L 21/312
257/E21.259
4,960,846 A * 10/1990 Burgess ............ C08G 73/1042
528/26
(Continued)

FOREIGN PATENT DOCUMENTS

CN 102127391 A 7/2011
EP 0102525 A2 3/1984
(Continued)

OTHER PUBLICATIONS

Morari et al., "Electrical Conductivity and Electromagnetic Shielding Effectiveness of Silicone Rubber Filled with Ferrite and Graphite Powders." Progress in Electromagnetics Research M, vol. 21, 93-104, 2011 (2011), pp. 94, 96, 99 [online] URL=<http://www.jpier.org/PIERM/pierm21/07.11080406.pdf>.

*Primary Examiner* — Matthew E Warren (57) ABSTRACT

A novel radiation hardened chip package technology protects microelectronic chips and systems in aviation/space or terrestrial devices against high energy radiation. The proposed technology of a radiation hardened chip package
(Continued)

using rare earth elements and mulitlayered structure provides protection against radiation bombardment from alpha and beta particles to neutrons and high energy electromagnetic radiation.

12 Claims, 6 Drawing Sheets

(51) Int. Cl.
    *H01L 23/552*     (2006.01)
    *H01L 21/78*     (2006.01)
    *H01L 23/31*     (2006.01)
    *H01L 21/311*     (2006.01)
    *H01L 23/495*     (2006.01)
    *H01L 23/00*     (2006.01)

(52) U.S. Cl.
    CPC ........ *H01L 23/3107* (2013.01); *H01L 23/552* (2013.01); *H01L 23/3128* (2013.01); *H01L 23/49562* (2013.01); *H01L 24/73* (2013.01); *H01L 2224/03831* (2013.01); *H01L 2224/04042* (2013.01); *H01L 2224/32225* (2013.01); *H01L 2224/32245* (2013.01); *H01L 2224/48091* (2013.01); *H01L 2224/48227* (2013.01); *H01L 2224/48247* (2013.01); *H01L 2224/73265* (2013.01); *H01L 2224/83192* (2013.01); *H01L 2924/15311* (2013.01); *H01L 2924/181* (2013.01)

(58) Field of Classification Search
    CPC ..... H01L 2224/04042; H01L 23/49562; H01L 21/56; B32B 15/08
    USPC ........................... 257/660, E21.259; 438/113
    See application file for complete search history.

(56) References Cited

U.S. PATENT DOCUMENTS

| | | | |
|---|---|---|---|
| 5,406,114 A * | 4/1995 | Brenndoerfer .... | H01L 23/49562 257/584 |
| 5,998,867 A | 12/1999 | Jensen et al. | |
| 6,255,719 B1 | 7/2001 | Kuriyama et al. | |
| 6,261,508 B1 * | 7/2001 | Featherby ............. | H01L 23/055 257/E23.114 |
| 6,319,740 B1 | 11/2001 | Heffner et al. | |
| 7,439,548 B2 * | 10/2008 | Shum .................... | H01L 33/382 257/100 |
| 2004/0001299 A1 * | 1/2004 | van Haaster ......... | G02B 6/4277 361/118 |
| 2009/0166819 A1 * | 7/2009 | Chen ..................... | B82Y 30/00 257/659 |
| 2010/0009165 A1 | 1/2010 | Patel et al. | |
| 2011/0068441 A1 | 3/2011 | Pannetier et al. | |
| 2012/0186742 A1 * | 7/2012 | Kang ....................... | B32B 5/26 156/324 |
| 2012/0187549 A1 * | 7/2012 | Lee ....................... | H01L 23/291 257/659 |
| 2013/0056641 A1 | 3/2013 | Vitale et al. | |

FOREIGN PATENT DOCUMENTS

| | | |
|---|---|---|
| JP | S59134858 A | 8/1984 |
| JP | S59208862 A | 11/1984 |
| JP | S628097 A | 1/1987 |
| JP | H05267504 A | 10/1993 |
| JP | H0817956 A | 1/1996 |
| JP | 2008042152 A | 2/2008 |
| WO | 2011139384 A1 | 11/2011 |

* cited by examiner

Figure 1

Prior Art

RADIATION HARDENED MICROELECTRONIC CHIP PACKAGING TECHNOLOGY

CROSS REFERENCE TO RELATED APPLICATION

This Application claims the benefit of U.S. Provisional Application No. 61/855,488 filed on May 16, 2013 for "RADIATION HARDENED MICROELECTRONIC CHIP PACKAGING TECHNOLOGY."

STATEMENT REGARDING FEDERALLY SPONSORED RESEARCH OR DEVELOPMENT

The invention described herein was made in the performance of work under a NASA cooperative agreement and by employees of the United States Government and is subject to the provisions of Public Law 96-517 (35 U.S.C. § 202) and may be manufactured and used by or for the Government for governmental purposes without the payment of any royalties thereon or therefore. In accordance with 35 U.S.C. § 202, the cooperative agreement recipient elected to retain title.

BACKGROUND OF THE INVENTION

1. Field of the Invention

The present invention relates to hardened chip package technology and more particularly to hardened chip package technology against high energy radiation.

2. Description of Related Art

All references listed in the appended list of references are hereby incorporated by reference, however, as to each of the above, to the extent that such information or statements incorporated by reference might be considered inconsistent with the patenting of this/these invention(s) such statements are expressly not to be considered as made by the applicant(s). The reference numbers in brackets below in the specification refer to the appended list of references.

Figure 1:
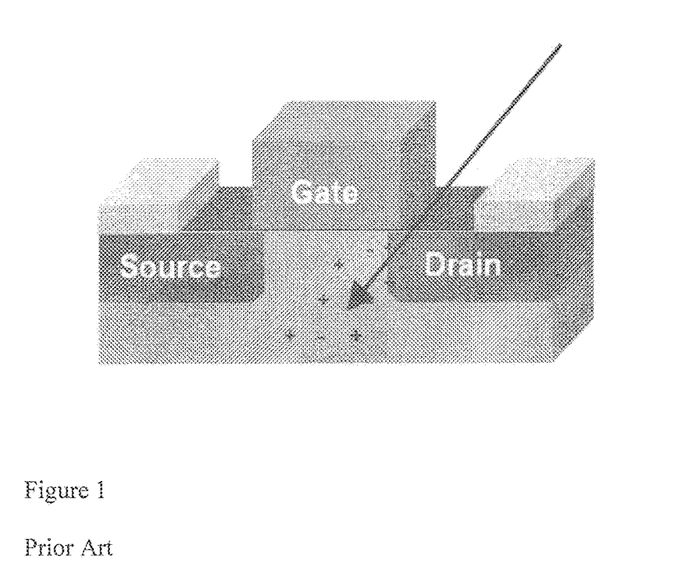
FIG. 1 shows radiation damage of a microelectronic chip.

High energy radiation is ubiquitous in the space environment and can cause calculation and memory failures in microelectronic devices (FIG. 1) [Ref. 1]. In addition, with the increase in the integration and density of microelectronic circuit chips, the transistors, which are getting much smaller, are more vulnerable to catastrophic failure mechanisms that can be triggered when high energy radiation or high energy particles, such as heavy ions, protons, alpha particles, and neutrons pass through the device structure.

The present invention provides radiation hardened chip packaging technology that protects avionic devices against high energy radiation during space exploration and high altitude flight. There have been several attempts to reduce radiation damage, such as a new logical design to correct the soft error and a physical design to increase gate charge [Refs. 2 and 3]. However, these methods require an additional volume increase of the microelectronic chip and a resulting higher power consumption, which limits the size and capability of the device. Thus, the implementation of specialized microchips used in aerospace has been slow due to the longer times, higher costs, and limited markets required for separate design and manufacturing of the current style of radiation hardened chips. Unfortunately, even these new configurations cannot promise reliable protection against radiation damage. Other methods are utilizing radiation shielding materials as packaging materials [Refs. 4 and 5]. However, these methods cannot protect against various radiation sources. In addition, the complicated process hinders the use of those technologies in semiconductor chip manufacturing without further investment in facilities.

It is a primary object of the present invention to provide an efficient shielding packaging composed of a multi-layered structure of rare earth element/polymer composites, which can be applicable to any structure of microelectronic circuit chip to protect from a variety of radiation sources from alpha particles and neutrons to high energy electromagnetic radiation.

It is an object of the invention to provide radiation hardened chip packaging technology which can be applicable to current semiconductor chip packaging processes.

It is an object of the invention to provide sensor and actuator devices fabricated with radiation hardened packaging materials.

It is an object of the invention to provide microprocessor and memory chips fabricated with radiation hardened packaging materials.

It is an object of the invention to provide electronic and optoelectronic parts fabricated with radiation hardened packaging materials.

It is an object of the invention to provide electronic and electrical systems protected by radiation hardened packaging technology.

Finally, it is an object of the present invention to accomplish the foregoing objectives in a simple and cost effective manner.

The above and further objects, details and advantages of the invention will become apparent from the following detailed description, when read in conjunction with the accompanying drawings.

SUMMARY OF THE INVENTION

The present invention addresses these needs by providing a method for forming a hardened chip package for a circuit chip. A circuit chip is first coated with an alpha particle shielding material; the alpha particle shielding material is then coated with a high energy particle shielding composite material; then the high energy particle shielding composite material is coated with a high energy electromagnetic (EM) wave shielding composite material, to form a coated circuit chip; and finally, the coated circuit chip, the alpha particle shielding material, the high energy particle shielding composite material and the high energy EM wave shielding composite material are encapsulated with a molding compound. If needed, holes are etched in the alpha particle shielding material coating for the attachment of wiring. An additional alternate embodiment is to, following the coating with a high energy EM wave shielding composite material step, etch holes in the alpha particle shielding material coating, the high energy particle shielding composite material and the high energy EM wave shielding composite material for the attachment of wiring. The coated circuit chip may be sliced into a plurality of dies, each of which is attached to a pad; and wiring is attached to the coated circuit chip. The alpha particle shielding material is preferably a pristine polyimide and more preferably a siloxane containing polyimide. The high energy particle shielding composite material is preferably a gadolinium/polyimide composite and, more preferably, a gadolinium/polyimide composite which is 5 wt % Gd. The high energy electromagnetic (EM) wave shielding composite material is preferably a rare earth element, and more preferably further includes a layered film of composite with conductive particles or composite with carbon nan tubes. Alternatively, the high energy EM wave shielding composite material may be infused with silver. A hardened chip package for a circuit chip prepared according to the method of claim 1 is disclosed.

BRIEF DESCRIPTION OF THE DRAWINGS

A more complete description of the subject matter of the present invention and the advantages thereof, can be achieved by reference to the following detailed description by which reference is made to the accompanying drawings in which.

ELEMENT LIST

10 Integrated circuit die
12 Alpha particle shielding (L1)
14 High energy particle (p,n, etc.) shielding (L2)
16 High energy EM shielding (L3)
18 Insulating molding compound (L4)
20 Wiring
22 Solder balls
24 A ball grid array chip scale package with radiation hardened technology
26 A ball grid array chip scale package with modified radiation hardened technology to minimize cross talk

DETAILED DESCRIPTION OF THE PREFERRED EMBODIMENT

The following detailed description is of the best presently contemplated mode of carrying-out the invention. This description is not to be taken in a limiting sense, but is made merely for the purpose of illustrating general principles of embodiments of the invention. The embodiments of the invention and the various features and advantageous details thereof are more fully explained with reference to the non-limiting embodiments and examples that are described and/or illustrated in the accompanying drawings and set forth in the following description. It should be noted that the features illustrated in the drawings are not necessarily drawn to scale, and the features of one embodiment may be employed with the other embodiments as the skilled artisan recognizes, even if not explicitly stated herein. Descriptions of well-known components and techniques may be omitted to avoid obscuring the invention. The examples used herein are intended merely to facilitate an understanding of ways in which the invention may be practiced and to further enable those skilled in the art to practice the invention. Accordingly, the examples and embodiments set forth herein should not be construed as limiting the scope of the invention, which is defined by the appended claims. Moreover, it is noted that like reference numerals represent similar parts throughout the several views of the drawings.

Figure 2A:
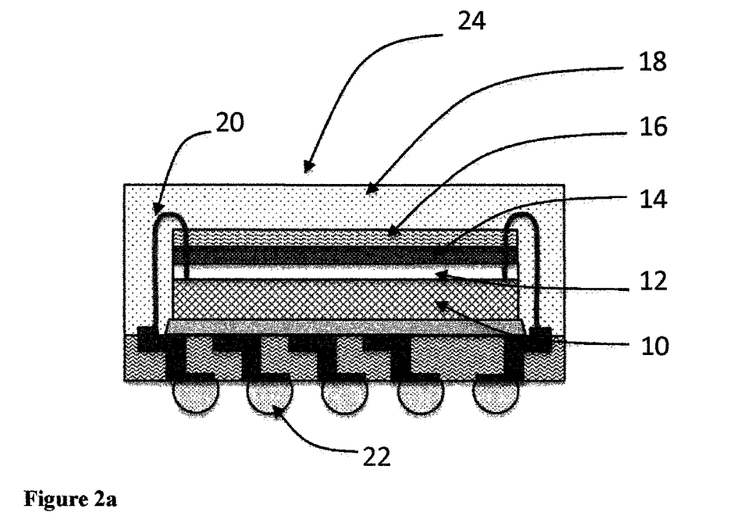
FIG. 2a is a schematic diagram of radiation hardened microelectronic chip packaging.

The present technology, as shown in FIG. 2a, uses a multilayered structure of rare earth element/polymer composites which is applicable to any structure of microelectronic circuit chip to provide protection from a variety of radiation sources from alpha particles and neutrons to high energy electromagnetic radiation. A ball grid array chip scale package 24 is employed in FIG. 2a, but this technology is not limited and may be applied to other packaging technologies such as a quad flat package, a small outline package, a thin small outline package, a flip chip package, a dual in line package, a multichip module package, a flatpack package or a zig-zag in-line package.

The preferred method is to shield the devices, including the circuit chip, using a high performance package insulator. A polyimide coating placed over the chip surface stops alpha particles with energies up to approximately 9 MeV, and rare earth elements, such as Gadolinium and Samarium provide protection against high altitude radiation. Galactic Cosmic Rays (GCRs), and Solar Particle Events (SPEs). The neutron absorption cross sectional area of the rare earth element $Gd^{157}$ is $2.59 \times 10^5$ barns, two orders of magnitude higher than that of $B^{10}$ ($3.84 \times 10^3$ barns) widely considered as a neutron absorber. In particular, $Gd^{157}$ does not produce secondary fission byproducts of alpha particles, which are one of the sources of radiation soft errors in circuits irradiated by neutrons.

Figure 2B:
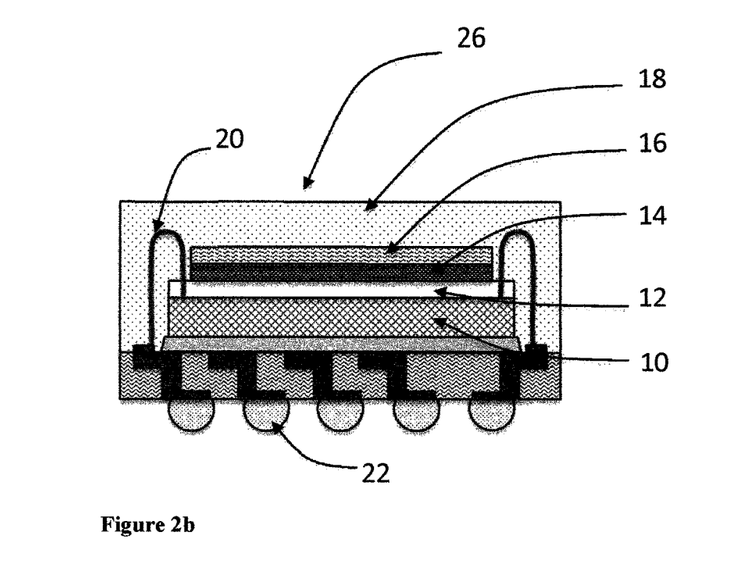
FIG. 2b is a schematic diagram of radiation hardened microelectronic chip packaging in which layers L2 and L3 are etched to allow wiring to pass through only L1.
Figure 3A:
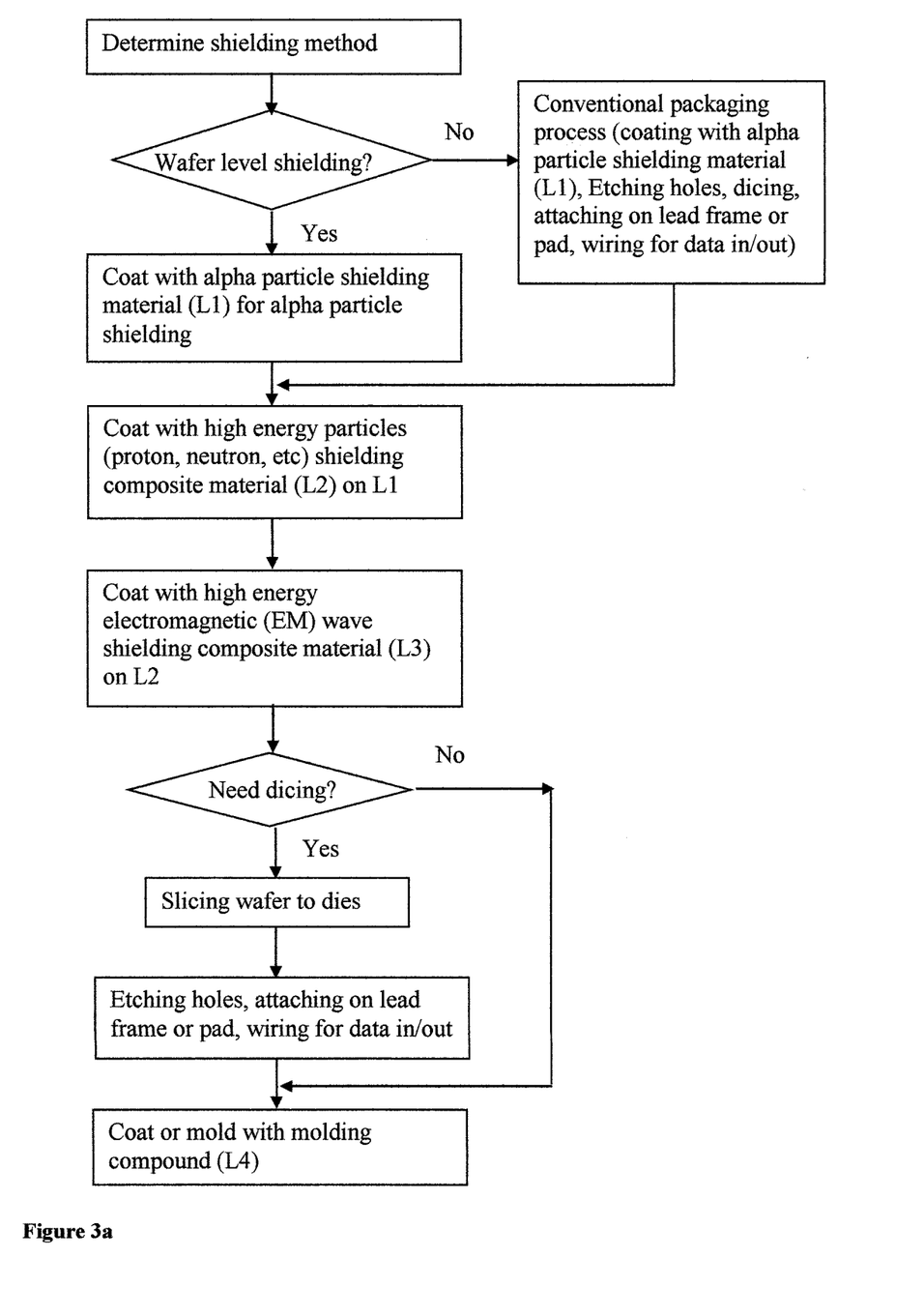
FIG. 3a is a diagram of a process of radiation hardened chip package.
Figure 3B:
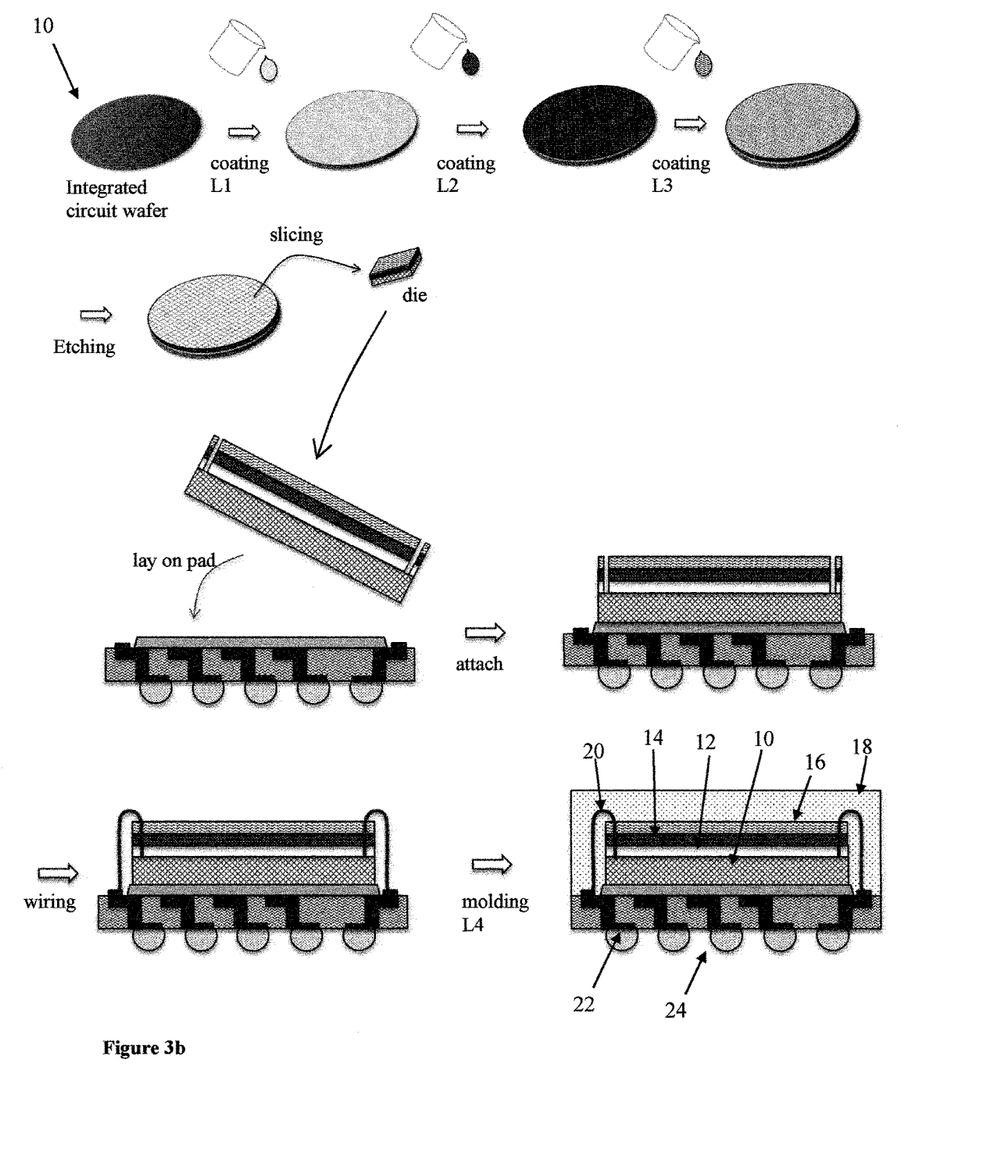
FIG. 3b shows the process for wafer level shielding.

FIG. 3a sets forth the process for producing the radiation hardened chip packaging or technology. First, determine the shielding packaging methods of wafer level shielding or die level shielding. Second, an alpha particle shielding layer (L1) 12 is coated oil the bare wafer or die 10 (prior art) to protect against alpha particles as shown in FIG. 2a. Although any alpha particle shielding material, such as a pristine polyimide other than one containing Gd or CNT, is satisfactory, for better adhesion property, a siloxane containing polyimide is preferred. Third, a high energy particle (proton, neutron, etc) shielding composite material (L2) 14 is coated on L1 12. Fourth, a high energy electromagnetic wave shielding composite material (L3) 16 is coated on L2 14. Fifth, the coated shielding layers are etched to have holes for wiring 20 if needed. The coated L2 14 or L3 16 may be etched or partially coated in order to minimize a cross talk issue between wires 20 as shown in FIG. 2b on the ball grid array chip scale package with modified radiation hardened technology to minimize cross talk 26. The wafer is sliced into dies if needed and attached on the lead frame or pad to wiring 20 for data transfer. Last, the die coated with the described multilayer shielding is encapsulated with a proper molding compound, such as an epoxy molding compound, (L4) 18. A conventional molding compound may be used as L4 18, but a radiation hardened resin also may be used as L4 18 for more efficient shielding. FIG. 3b shows the process for wafer level shielding.

Figure 4:
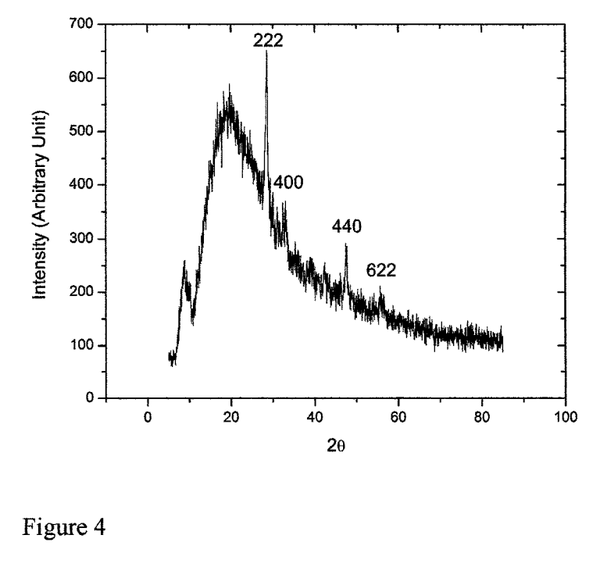
FIG. 4 shows the X-ray diffraction pattern of a Gadolinium/polyimide composite.

A Gadolinium/polyimide composite is the preferred candidate material for the layer (L2) 14 which shields the chip from high energy particles. Gadolinium/polyimide is preferably prepared by in-situ polymerization. FIG. 4 shows the cubic crystalline structure of gadolinium oxide ($Gd_2O_3$) in polyimide matrix.

Figure 5:
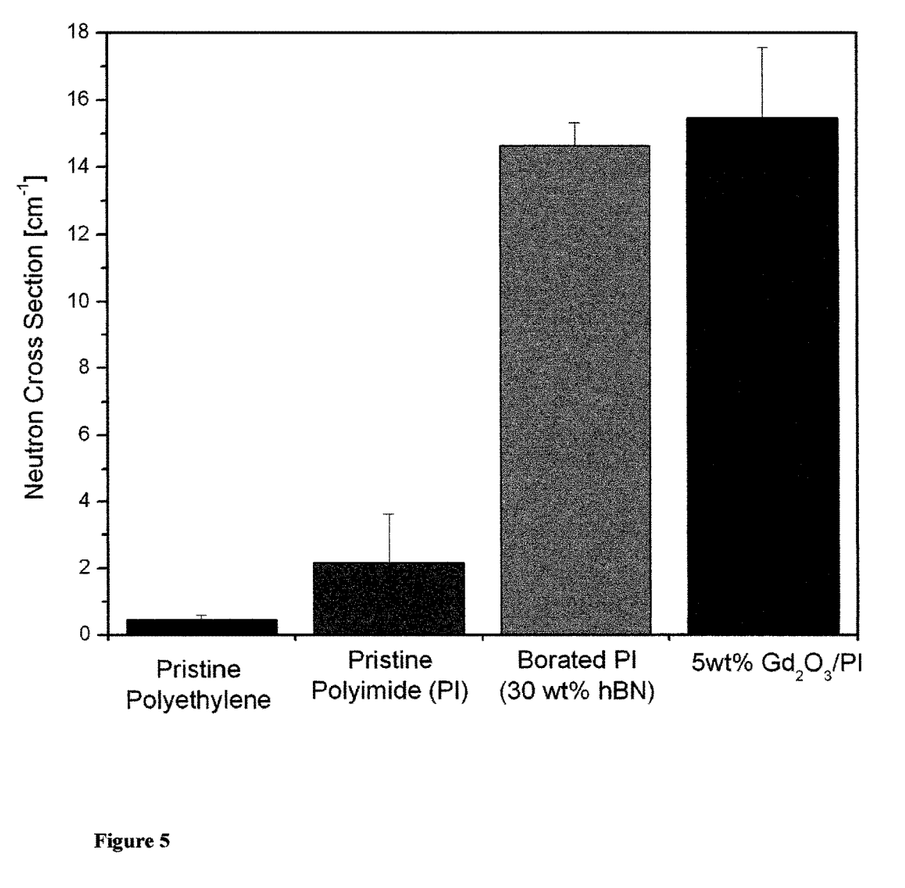
FIG. 5 shows the radiation shielding effect of a Gadolinium/polyimide composite.

FIG. 5 shows the neutron cross sections for pristine polyethylene, pristine polyimide, borated polyimide (30 wt % hBN) and a polyimide composite containing 5 wt % Gd. The cross sections were obtained using a LaRC 1 Ci Americium-Beryllium neutron source (moderated by a polyethylene block). It can be seen from FIG. 5 that the Gd/polyimide composite has the largest neutron cross section making it the preferred shielding material. The Gd composite shows a 3240% higher shielding effectiveness as compared to polyethylene, duo to Gd's large neutron absorption cross section of about 49700 barns. Moreover the effective shielding is obtained at low Gd loading (5 wt %) ensuring that the material retains its flexibility, processibility and other desirable properties arising from the use of the polyimide matrix. Comparable shielding with hBN requires 30 wt % filler content.

Magnetic properties of rare earth elements efficiently block electromagnetic wave propagation further into the chips. In addition, by layering an additional film of composite with conductive panicles or carbon nanotubes, the EMI shielding effect can be enhanced through conductive skin effect. Compared to pristine polyimide, 1% carbon nanotube/polyimide composite film showed about a 400% increase in shielding effectiveness (3 dB) at 10 GHz. Additional silver infusion enhanced the shielding effectiveness by about 480% compared to pristine polyimide.

The radiation hardening tests of the memory chip were performed in a radiation facility lab. A memory tester was installed next to the thermal neutron source (A 1 Ci Am/Be source surrounded by a polyethylene block to moderate the neutrons) with a proper shield. Non-volatile flash memory chips (NAND Flash) with/without radiation hardened composite coatings were attached the holder of the memory tester and characterized in real-time during exposure to neutron irradiation. Without a radiation hardened composite coating, the failure rate was $1.14 \times 10^{-7}$/bit/hour during 5 days exposure. With Gadolinium/polyimide composite film shielding (about 37 μm thick), the failure rate was $8.49 \times 10^{-11}$/bit/hour, which showed 100,000% decrease in failure.

Novel multilayered structures are designed so that each layer can protect against each radiation source like neutrons, protons, alpha particles, and high energy electromagnetic radiation.

The present invention produces knowledge, data, and design tools applicable to all flight regimes, including space missions. Further, the use of radiation hardened packaging materials allows the placement of sensors and/or instruments in harsh environments so that data axe obtained for quantification of vehicle performance. Because this technology involves radiation shielding with chip scale packaging of rare earth nanostructured polymer composites, this also contributes to Ionizing Radiation Effects Hazard Management, and the outcome of the developed technology benefits space exploration vehicle systems, such as nuclear powered systems and the High Mass Mars Entry System. Further, this technology protects electronic devices against radiation showers from nuclear accidents or nuclear warfare.

Obviously, marry modifications may be made without departing from the basic spirit of the present invention. Accordingly, it will be appreciated by those skilled in the art that within the scope of the appended claims, the invention may be practiced other than has been specifically described herein. Many improvements, modifications, and additions will be apparent to the skilled artisan without departing from the spirit and scope of the present invention as described herein and defined in the following claims.

LIST OF REFERENCES

[Ref. 1] M. O'Bryan et al., IEEE NSREC10 Data workshop, July 2010
[Ref. 2] S. Krishnamohan et al., IEEE International SOC Conference 2004, pp 227-230
[Ref. 3] Q. Zhou et al, IEEE Trans. Comp. Des. Integ. Circ. Sys., 25, 155 (2006).
[Ref. 4] M. Sono, U.S. Pat. No. 4,661,837
[Ref. 5] D Czajkowski et al., U.S. Pat. No. 5,880,403

What is claimed is:

1. A method for forming a hardened chip package for a circuit chip, comprising:
   providing a bare circuit chip;
   coating the circuit chip with an alpha particle shielding material;
   coating the alpha particle shielding material with a high energy particle shielding composite material;
   coating the high energy particle shielding composite material with a high energy electromagnetic (EM) wave shielding composite material wherein a coated circuit chip is formed; and
   encapsulating the coated circuit chip, the alpha particle shielding material, the high energy particle shielding composite material and the high energy EM wave shielding composite material with a molding compound.

2. The method of claim 1 following the coating with an alpha particle shielding material step, further comprising:
   etching holes in the alpha particle shielding material coating for the attachment of wiring.

3. The method of claim 1 following the coating with a high energy EM wave shielding composite material step, further comprising:
   etching holes in the alpha particle shielding material coating, the high energy particle shielding composite material and the high energy EM wave shielding composite material for the attachment of wiring;
   slicing the coated circuit chip into a plurality of dies;
   attaching each of the plurality of dies to a pad; and
   attaching at least one wire to the circuit chip.

4. The method of claim 1 wherein the alpha particle shielding material is a pristine polyimide.

5. The method of claim 1 wherein the alpha particle shielding material is a siloxane containing polyimide.

6. The method of claim 1 wherein the high energy particle shielding composite material is a gadolinium/polyimide composite.

7. The method of claim 6 wherein the high energy particle shielding composite material is a gadolinium/polyimide composite is 5 wt % Gd.

8. The method of claim 1 wherein the high energy electromagnetic (EM) wave shielding composite material is a rare earth element.

9. The method of claim 1 wherein the high energy EM wave shielding composite material coating step further comprises layering a film of composite with conductive particles.

10. The method of claim 1 wherein the high energy EM wave shielding composite material coating step further comprises layering a film of composite with carbon nanotubes.

11. The method of claim 1 wherein the high energy EM wave shielding composite material coating step further comprises infusing the high energy EM wave shielding composite material with silver.

12. A hardened chip package for a circuit chip prepared according to the method of claim 1.

* * * * *

UNITED STATES PATENT AND TRADEMARK OFFICE
CERTIFICATE OF CORRECTION

PATENT NO. : 10,262,951 B2  
APPLICATION NO. : 14/279601  
DATED : April 16, 2019  
INVENTOR(S) : Jin Ho Kang et al.

Page 1 of 1

It is certified that error appears in the above-identified patent and that said Letters Patent is hereby corrected as shown below:

In the Specification

Column 4, Line 31: the phrase "coated oil" should be -- coated on --

Column 5, Line 2: the phrase "duo to" should be -- due to --

Column 5, Line 12: the phrase "conductive panicles" should be -- conductive particles --

Column 5, Line 40: the phrase "date axe obtained" should be -- data are obtained --

Column 5, Line 50: the phrase "marry modifications" should be -- many modifications --

Signed and Sealed this  
Eleventh Day of June, 2019

Andrei Iancu  
*Director of the United States Patent and Trademark Office*